United States Patent
Huang et al.

(10) Patent No.: US 6,212,486 B1
(45) Date of Patent: Apr. 3, 2001

(54) METHOD OF IDENTIFYING CRITICAL ELEMENTS IN FATIGUE ANALYSIS WITH VON MISES STRESS BOUNDING AND FILTERING MODAL DISPLACEMENT HISTORY USING DYNAMIC WINDOWING

(75) Inventors: Liping Huang, Southgate; Hari Agrawal, Farmington Hills, both of MI (US)

(73) Assignee: Ford Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/156,195

(22) Filed: Sep. 17, 1998

(51) Int. Cl.$^7$ .............................. G06G 7/48; G06F 17/50
(52) U.S. Cl. .......................... 703/7; 703/1; 703/8; 703/2
(58) Field of Search ................... 703/2, 6, 7, 8, 703/1

(56) References Cited

U.S. PATENT DOCUMENTS

| | | | |
|---|---|---|---|
| 4,336,595 | 6/1982 | Adams et al. | 364/508 |
| 4,742,473 * | 5/1988 | Shugar et al. | 703/7 |
| 4,858,146 * | 8/1989 | Shebini | 703/8 |
| 5,136,497 * | 8/1992 | Coe et al. | 703/2 |
| 5,185,701 | 2/1993 | Blackburn et al. | 364/425 |
| 5,202,837 * | 4/1993 | Coe et al. | 703/2 |
| 5,289,567 * | 2/1994 | Roth | 703/2 |
| 5,345,402 | 9/1994 | Gioutsos et al. | 364/578 |
| 5,508,915 * | 4/1996 | Tsao et al. | 702/9 |
| 5,565,618 * | 10/1996 | Hu | 73/662 |
| 5,729,463 | 3/1998 | Koenig et al. | 364/468.04 |
| 5,736,645 | 4/1998 | Chin-Chan et al. | 73/799 |
| 5,750,890 | 5/1998 | Fricke et al. | 73/146 |
| 5,847,259 * | 12/1998 | Hu | 702/42 |
| 5,930,155 * | 7/1999 | Tohi et al. | 73/146 |
| 5,940,788 * | 8/1999 | Mornman et al. | 702/39 |
| 5,956,500 * | 9/1999 | Shimmell | 703/8 |
| 6,009,378 * | 12/1999 | Tang et al. | 702/34 |

OTHER PUBLICATIONS

"A Triangular Plate Finite Element for Large Displacement Eleastic–Plastic Analysis of Automobile Structural Components", Chen, Computers and Structures, 1978.*
"Case Study: Effecient Visualization of Physical and Structural Properties in Crash Worthiness Simulation", Kuschfeldt et al., 1997 IEEE.*
"A Triangular Plate Finite Element for Large Displacement Eleastic–Plastic Analysis of Automobile Structural Components", Chen, Computers and Structures, Apr. 1979.*
*Dynamic Durability Analysis of Automotive Structures*, by Liping Huang, Lokesh Tunega Hari Agrawal and Praba Kurudiyara, SAE 980695, presented Feb. 23–26, 1998, pp. 1–7.

* cited by examiner

Primary Examiner—Kevin J. Teska
Assistant Examiner—William Thomson
(74) Attorney, Agent, or Firm—David B. Kelley

(57) ABSTRACT

A method of dynamic durability analysis and fatigue area identification using modal techniques for a structure includes the steps of simulating a finite element model of the structure to determine modal stresses and modal displacements for an element of the structure and performing a modal transient analysis using the modal displacements. The method also includes the steps of determining a stress bound for the element from the modal stresses and modal transient analysis, determining if a stress bound for the element is greater than a predetermined value and identifying the element as a critical element if the stress bound for the element is greater than the predetermined value. The method further includes the steps of determining a stress time history for the critical element and using the stress time history to perform a fatigue analysis to identify an area of fatigue within the structure.

12 Claims, 3 Drawing Sheets

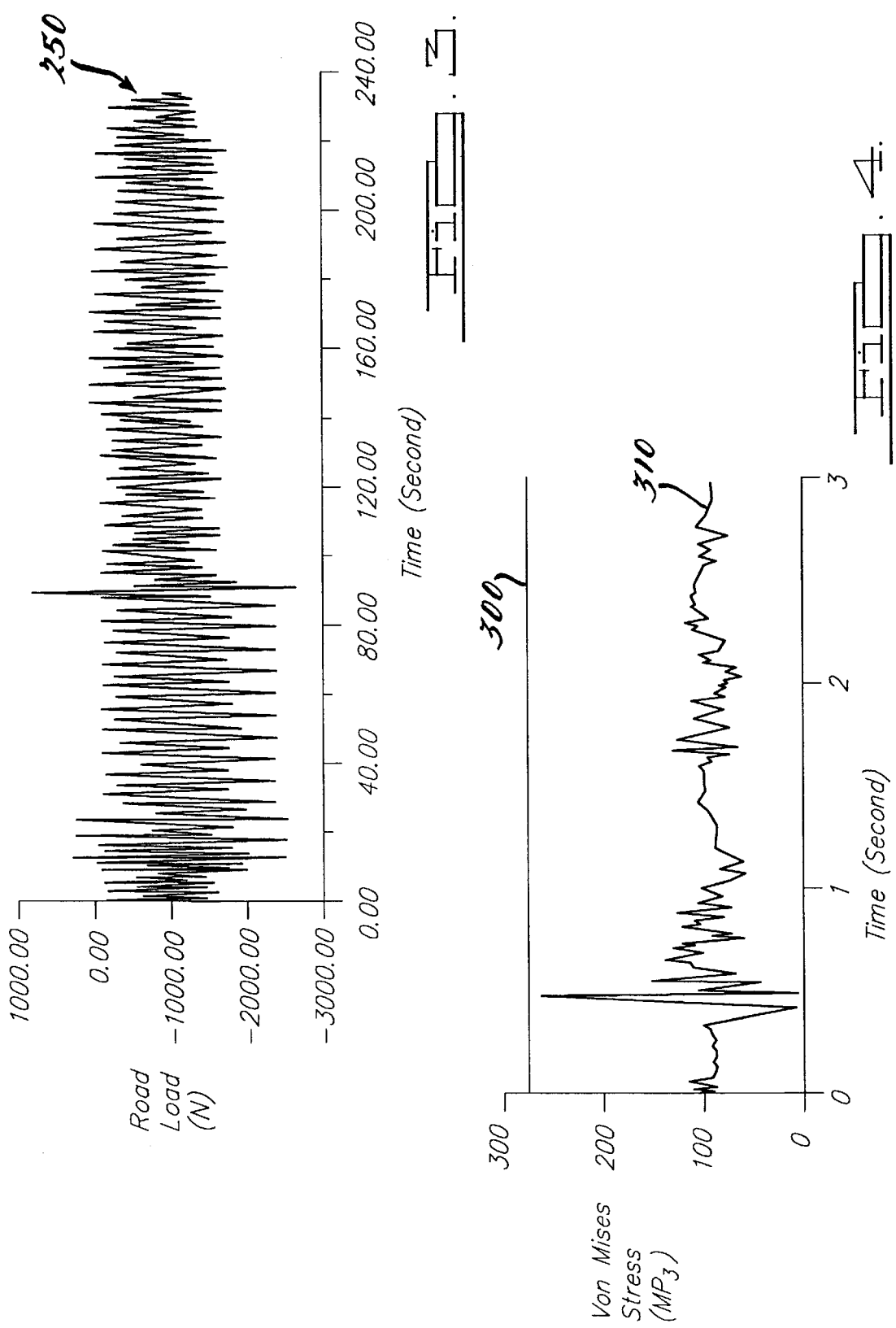

METHOD OF IDENTIFYING CRITICAL ELEMENTS IN FATIGUE ANALYSIS WITH VON MISES STRESS BOUNDING AND FILTERING MODAL DISPLACEMENT HISTORY USING DYNAMIC WINDOWING

BACKGROUND OF THE INVENTION

1. Field of the Invention

The present invention relates generally to a method of dynamic durability analysis and fatigue area identification and, more specifically, to a method of dynamic durability analysis and fatigue area identification using modal techniques for a structure.

2. Description of the Related Art

The trend in the vehicle industry, and in particular the motor vehicle industry, is to reduce new product development cycle time, from conception to sale. From an engineering perspective, increasingly sophisticated analysis techniques are being utilized in simulating a vehicle structure to predict vibrational characteristics of a motor vehicle. For example, in the field of motor vehicle dynamics, a widely known method of finite element analysis is utilized to identify natural modes and frequencies and predict stress responses and fatigue life of the vehicle structure. The finite element model commonly utilizes simple loads, for static as well as quasi-static (inertia relief) methods, to determine stresses and fatigue life in the vehicle structure. However, these methods may not identify all durability-related areas of the motor vehicle that are dynamic in nature and respond with elastic vibrations. The finite element model may also use modal analysis, including transient modal analysis, to identify natural modes, frequencies and corresponding stress responses. However, this technique is limited to only a few seconds of dynamic durability road load data or for a few known elements of the structure.

These techniques are not feasible for predicting potential high stress responses within a large structure, such as a complete motor vehicle, due to the prohibitive amount of computer time and memory necessary to analyze the data for such a vehicle structure. Fatigue life prediction needs a complete structural stress time response history, therefore, the computational time is significant. For example, a finite element model of a motor vehicle may include approximately 200,000 elements and a vehicle durability test route may last 30 to 60 minutes. Determining the dynamic stress time history of such a model using conventional methods would require over 200 days of computer processing time. The computational magnitude of determining the stress response for each element within the vehicle structure renders current methods impractical. The problem is described in a Society of Automotive Engineers paper entitled, "Dynamic Durability Analysis of Automotive Structures" by L. Huang, H. Agrawal and P. Kurudiyara, SAE No. 980695, presented Feb. 23–26, 1998, which is hereby incorporated by reference. Thus, there is a need in the art for an efficient method of calculating a dynamic stress time history for a structure to predict fatigue life within the structure.

SUMMARY OF THE INVENTION

Accordingly, the present invention is a method of dynamic durability analysis and fatigue area identification for a structure. The method includes the steps of simulating a dynamic finite element model of the structure to determine modal stresses and modal displacements for an element of the structure and performing a modal transient analysis using the modal displacements. The method also includes the steps of determining a stress bound for the element from the modal stresses and modal transient analysis, determining if a stress bound for the element is greater than a predetermined value and identifying the element as a critical element if the stress bound for the element is greater than the predetermined value. The method further includes the steps of determining a stress time history for the critical element and using the stress time history to perform a fatigue analysis to identify an area of fatigue within the structure.

One advantage of the present invention is that the method is applicable to a large structure, such as a motor vehicle structure, subject to complex dynamic loads due to the diverse road conditions experienced over the life of the motor vehicle. Another advantage of the present invention is that it uses well known finite element analysis techniques to perform the dynamic stress calculations required to obtain the stress time history of the structure. Yet another advantage of the present invention is that the method is computationally efficient by determining a stress bound to select a critical stress element, and by calculating the stress time history of only the critical elements.

Other features and advantages of the present invention will be readily appreciated as the same becomes better understood after reading the subsequent description when considered in connection with the accompanying drawings.

BRIEF DESCRIPTION OF THE DRAWINGS

FIG. 3 is a graph of road load time history.

FIG. 4 is a graph of a stress time history for an element.

DESCRIPTION OF THE PREFERRED EMBODIMENT(S)

Figure 1:
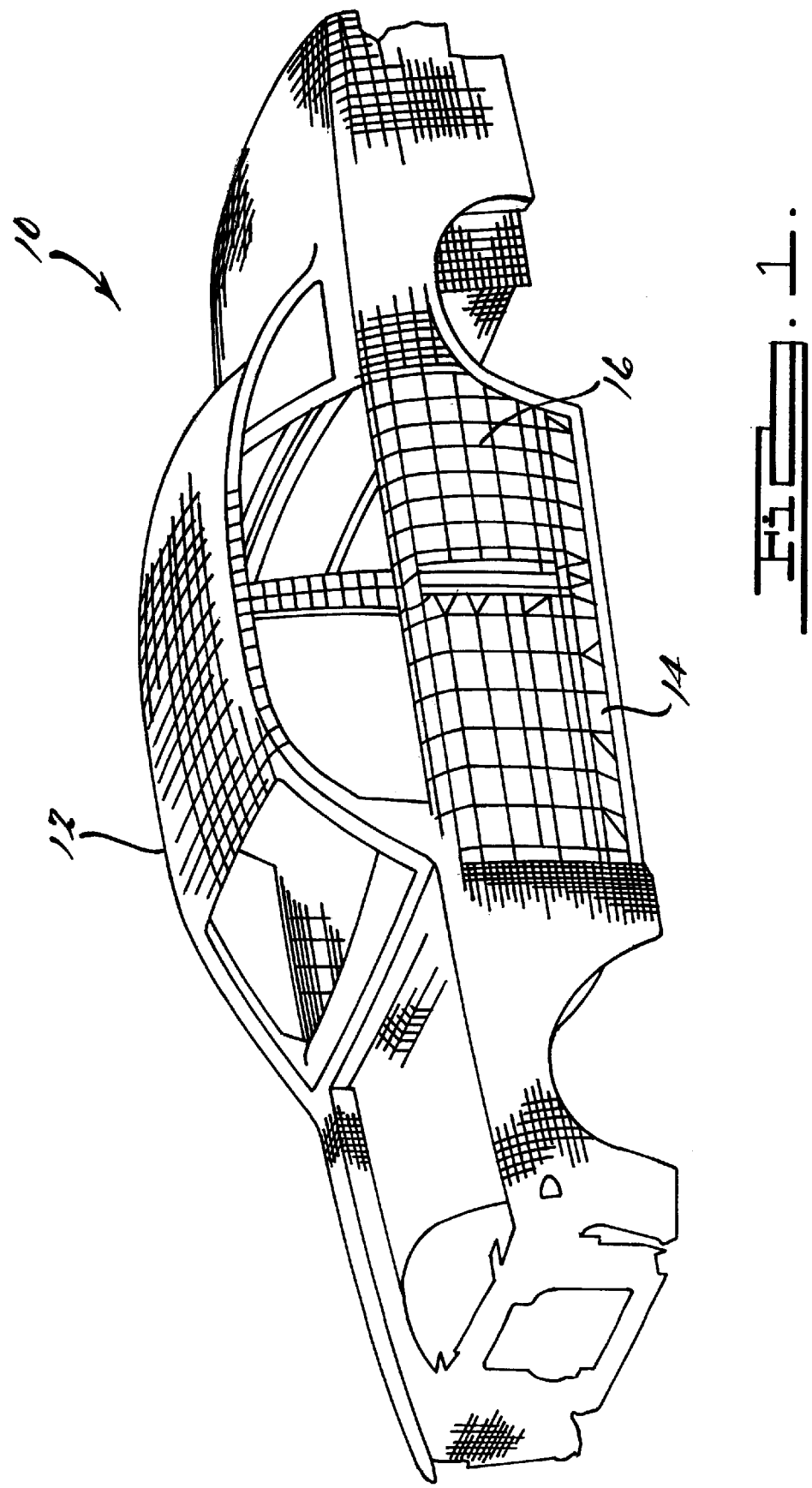
FIG. 1 is a perspective view of a finite element model of a vehicle body structure, according to the present invention.

Referring to the drawings, and in particular FIG. 1, one embodiment of a vehicle 10 is illustrated for the operational features of the present invention. At the outset, it will be apparent to one skilled in the art that the present invention, though disclosed for a vehicle 10, and in particular a motor vehicle, is applicable to other types of structures.

The vehicle 10 includes a structure, also referred to in the art as a body 12, that provides an attachment for other various components, to such as a door 14. As is well known in the art, the body 12 is subject to numerous stresses, loads and vibrations over the life of the vehicle 10, because of the multitude of driving conditions experienced, in conjunction with its inherently complex stiffness, mass and damping distributions. The loads excite many natural modes and generate high stresses and stress ranges that can cause cracks in the body 12. The fatigue life of a particular location of the body 12 is an estimation of crack initiation. Advantageously, the present method identifies critical areas of the vehicle 10 and predicts the fatigue life of those critical areas.

Figure 2:
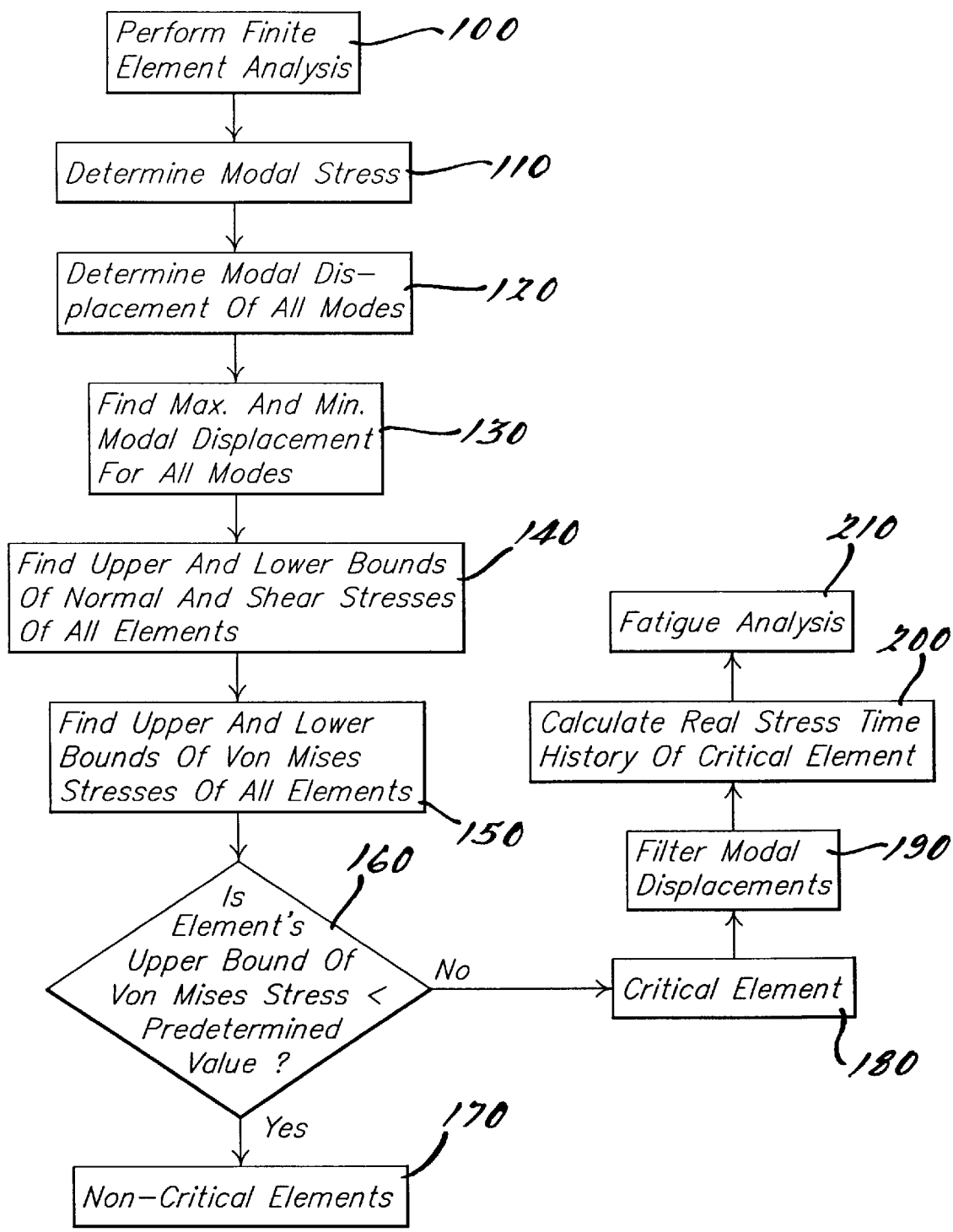
FIG. 2 is a flowchart of a method of dynamic durability analysis and fatigue area identification, according to the present invention, for the vehicle body structure of FIG. 1.

Referring to FIG. 2, a method of dynamic durability analysis and fatigue area identification, according to the present invention, is described in greater detail. The methodology begins in block 100 to perform finite element analysis. The methodology stimulates the body 12 using a finite element model analysis to obtain the modal stresses and displacements of the body 12. NASTRAN is a widely known computer program for simulating and analyzing a finite element model of a structure. NASTRAN utilizes a dynamic road load time history as an input. For example, to obtain a road load time history, a load measuring device, such as a load cell, may be positioned at various locations on the vehicle 10. The vehicle 10 is loaded, by operating the vehicle 10 over predetermined road conditions over a period of time. Referring to FIG. 3, an example of a road load 250 time history for a particular load cell is illustrated.

After block 100, the methodology advances to block 110. In block 110, the methodology determines a modal stress for the body 12. For example, NASTRAN subdivides the body 12 into small sections, referred to as an element 16, as shown in FIG. 1. NASTRAN establishes a modal stress $\sigma_x^1$ $\sigma_y^1$ and $\tau_{xy}^i$ of each element 16 (i=1, . . . n, n=total number of elements) for all modes (I=1, . . . k , k=total number of modes).

The methodology advances to block 120, and determines a modal displacement time history of all modes. For example, NASTRAN computes the modal displacement time history, $\xi_I(t), \ldots \xi_k(t)$ using all modes (assuming k modes) with a modal transient analysis technique. Three modal transient analysis techniques well known in the art include mode displacement, mode stress (or matrix) and component mode synthesis.

After block 120, the methodology advances to block 130. In block 130, the methodology determines the minimum and maximum values of modal displacements for all modes, expressed as $(\xi_I)_{max}, (\xi_I)_{min}, \ldots (\xi_k)_{max}, (\xi_k)_{min}$, from the modal displacement time history. The methodology advances to block 140.

In block 140, the methodology determines a modal stress component bounds for normal and shear stresses of each element 16 (i–1, . . . n). For each mode and for each element 16, the modal stresses from block 110 are multiplied by the corresponding maximum or minimum value of modal displacement to obtain the modal stress component bounds. It should be appreciated that the stress bound values of the stress components are used to compute the stress bounds. For example, for an element 16, the upper bound of the x-normal stress may be expressed as $$(\sigma_x^i)_{Ub} = \sum_{k=1}^{m} \sigma_x^{ik}(\xi)_m,$$

where $(\xi_k)_m = (\xi_k)_{max}$ if $\sigma_x^{ik} \geq 0$ or $(\xi_k)_m = (\xi_k)_{min}$ if $\sigma_x^{ik} < 0$ The lower bound of the x-normal stress may be similarly expressed as $$(\sigma_x^i)_{Lb} = \sum_{k=1}^{m} \sigma_x^{ik}(\xi_k)_m$$

where $(\xi_k)_m = (\xi_k)_{max}$ if $\sigma_x^{ik} \leq 0$ or $(\xi_k)_m = (\xi_k)_{min}$ if $\sigma_x^{ik} > 0$.

The upper bounds and lower bounds are calculated for the y-normal stress $\sigma_y$ and xy - shear stress $\tau_{xy}^i$ in a similar manner. The methodology advances to block 150.

In block 150, the methodology determines a combined stress bound of normal and shear stresses for each element 16 (i=1, . . . n) from the modal stress component bounds. The stress bound 300 is expressed as an upper bound of a Von Mises stress 310, as is known in the art. The upper bound of Von Mises stress 310 may be expressed as:

$$(\sigma_v^i)_{ub} = \frac{1}{\sqrt{2}}\left[(\sigma_x^i - \sigma_y^i)_{max}^2 + (\sigma_x^i)_{max}^2 + (\sigma_y^i)_{max}^2 + 6(\tau_{xy}^i)_{max}^2\right]^{1/2}$$

FIG. 4 illustrates a stress bound compared to a Von Mises stress over time.

If the upper bound of the Von Mises stress 310 of a particular element 16 is less than a predetermined value, such as a yield strength for a particular material, then the actual Von Mises stress 310 of the element 16 must be less than this value. Therefore, it can be assumed that the stress time history of that particular element 16 is within an acceptable bound. Advantageously, the efficiency of the methodology is improved if fewer modes are included in the analysis. The methodology advances to diamond 160.

In diamond 160, the methodology determines if each element 16 (i=1, . . . n) is a critical element. A critical element can be identified by comparing whether the Von Mises stress 310 $(\sigma_v^i)_{Ub}$ is less than the predetermined yield strength value for that particular material. An example of a stress bound 300 is 280 mPa. The critical elements are those elements 16 that require further analysis. Non-critical elements are not analyzed any further, since it is assumed that their stresses are less than the predetermined yield strength of the particular material.

If it is determined that an element 16 is a non-critical element, the methodology advances to block 170. In block 170, the methodology labels the element 16 as a non-critical element and the methodology continues.

Referring back to diamond 160, if the element is determined to be a critical element 16, the methodology advances to block 180. In block 180, the methodology labels the element as a critical element, since the maximum Von Mises stress 340 $(\sigma_v^i)_{Ub}$ is greater than the predetermined yield strength of the material. The methodology advances to block 190

In block 190, the methodology filters the modal displacements for each mode from block 120 using a dynamic window size. An example of a filtering window size is the maximum modal displacement less the minimum modal displacement multiplied by a predetermined filter value. The predetermined filter value is expressed as a percentage.

$$\text{windowsize}=[(\xi_k)_{max}-(\xi_k)_{min}][\text{filter value}]$$

An example of a filter value is ten percent (10%). The methodology advances to block 200.

In block 200, the methodology determines the dynamic stress time history for each critical element using the modal stress and the filtered modal displacement. The dynamic stress time history, as is well understood in the art, can be determined by calculating the normal and shear stress for each critical element at the filtered modal displacement as:

$$\sigma_x^i(t) = \sum_{l=1}^{m} \sigma_x^{il}\xi_l(t)$$

$$\sigma_y^j(t) = \sum_{l=1}^{m} \sigma_y^{jl} \xi_l(t)$$

$$\tau_{xy}^j(t) = \sum_{l=1}^{m} \sigma_{xy}^{jl} \xi_l(t)$$

the methodology advances to block 210.

In block 210, the methodology performs a fatigue analysis on a critical element, as is known in the art, using the dynamic stress time history. Advantageously, critical elements having a peak stress can be selected for further analysis. Examples of additional analysis known in the art include stress distribution tables, maximum Von Mises stress contour plot, stress time history x-y plot and stress spectrum x-y plot.

The present invention has been described in an illustrative manner. It is to be understood that the terminology which has been used is intended to be in the nature of words of description rather than of limitation.

Many modifications and variations of the present invention are possible in light of the above teachings. Therefore, within the scope of the appended claims, the present invention may be practiced other than as specifically described.

What is claimed is:

1. A computer implemented method of dynamic durability analysis and fatigue area identification for a structure comprising:
    simulating a finite element model of a structure to determine modal stresses and modal displacements for an element of the structure;
    performing a modal transient analysis using the modal displacements;
    determining a stress bound for the element from the modal stresses and modal transient analysis, wherein the stress bound is determined by finding an upper bound and a lower bound of a normal stress and a shear stress for the element, determining a Von Mises stress from the upper bound and the lower bound of the normal stress and the shear stress for the element and selecting the upper bound of the Von Mises stress as the stress bound;
    determining if the stress bound for the element is greater than a predetermined value, wherein the stress bound is the upper bound of a Von Mises stress;
    identifying the element as a critical element if the stress bound for the element is greater than the predetermined value;
    determining a stress time history for the critical element;
    using the stress time history to perform a fatigue analysis to identify an area of fatigue within the structure; and
    filtering the modal displacement time history using a dynamic window, prior to said step of determining a stress time history.

2. A computer implemented method of dynamic durability analysis and fatigue area identification for a structure comprising:
    simulating a finite element model of a structure to determine modal stresses and modal displacements for an element of the structure;
    performing a modal transient analysis using the modal displacements;
    determining a stress bound for the element from the modal stresses and modal transient analysis;
    determining if the stress bound for the element is greater than a predetermined value, wherein the stress bound is the upper bound of a Von Mises stress;
    identifying the element as a critical element if the stress bound for the element is greater than the predetermined value;
    determining a stress time history for the critical element;
    using the stress time history to perform a fatigue analysis to identify an area of fatigue within the structure; and
    filtering the modal displacement time history using a dynamic window, prior to said step of determining a stress time history.

3. A method as set forth in claim 2 wherein the dynamic window is a maximum modal displacement less a minimum modal displacement multiplied by a predetermined percentage.

4. A computer implemented method of dynamic durability analysis and fatigue area identification for a structure comprising:
    simulating a finite element model of a structure;
    determining a modal stress for each element of the finite element model;
    determining a modal displacement time history for each element of the finite element model;
    determining a minimum modal displacement value and a maximum modal displacement value for each mode from the modal displacement time history;
    determining an upper bound and lower bound of a normal stress and a shear stress for each element;
    determining a stress bound for each element from the upper bound and the lower bound of the normal stress and the shear stress;
    determining if the stress bound for each element is less than a predetermined value, wherein the stress bound is the upper bound of a Von Mises stress;
    identifying the element as a non-critical element if the stress bound is less than the predetermined value;
    identifying the element as a critical element if the stress bound is greater than the predetermined value;
    determining a dynamic stress time history of the critical element;
    using the dynamic stress time history to perform a fatigue analysis on the critical element to identify an area of fatigue within the structure; and
    filtering the modal displacement time history using a dynamic window, prior to said step of determining a dynamic stress time history.

5. A method as set forth in claim 4 wherein the dynamic window is a maximum modal displacement less a minimum modal displacement multiplied by a predetermined percentage.

6. A method as set forth in claim 5 wherein the modal displacement time history is determined by a modal transient analysis.

7. A computer implemented method of dynamic durability analysis and fatigue area identification for a structure, said method comprising the steps of:
    simulating a finite element model of a structure;
    determining a modal stress for each element of the finite element model;
    determining a modal displacement time history for each element of the finite element model by a modal transient analysis;
    determining a minimum modal displacement value and a maximum modal displacement value for each mode from the modal displacement time history;

determining an upper bound and lower bound of a normal stress and a shear stress for each element;

determining a stress bound for each element from the upper bound and the lower bound of the normal stress and the shear stress;

determining if the stress bound for each element is less than a predetermined material value;

identifying the element as a non-critical element if the stress bound is less than the predetermined value;

identifying the element as a critical element if the stress bound is greater than the predetermined value;

filtering the modal displacement time history using a dynamic window, wherein the dynamic window is a maximum modal displacement less a minimum modal displacement multiplied by a predetermined percentage;

determining a dynamic stress time history of the critical element; and using the dynamic stress time history to perform a fatigue analysis on the critical element to identify an area of fatigue within the structure; and wherein the stress bound is the upper bound of a Von Mises stress.

8. A method as set forth in claim 7 wherein the dynamic stress time history is determined from a normal stress and a shear stress for the critical element at a filtered modal displacement.

9. A computer implemented method of dynamic durability analysis and fatigue area identification for a vehicle comprising:

simulating a finite element model of a structure for a vehicle;

determining a modal stress for each element of the finite element model;

determining a modal displacement time history for each mode of the finite element model;

determining a minimum modal displacement value and a maximum modal displacement value for each mode from the modal displacement time history;

determining an upper bound and lower bound of a normal stress and a shear stress for each element;

determining a stress bound for each element, wherein the stress bound is a Von Mises stress determined from the upper bound and the lower bound of the normal stress and the shear stress;

determining if the stress bound for each element is less than a predetermined material yield strength;

identifying the element as a non-critical element if the stress bound is less than said predetermined yield strength;

identifying the element as a critical element if the stress bound is greater than said predetermined yield strengths;

filtering the modal displacement time history using a dynamic window;

determining a dynamic stress time history of the critical element; and using the dynamic stress time history to perform a fatigue analysis on the critical element to identify an area of fatigue within the structure.

10. A method as set forth in claim 9 wherein the dynamic window is a maximum modal displacement less a minimum modal displacement multiplied by a predetermined percentage.

11. A method as set forth in claim 10 wherein the modal displacement time history is determined by a modal transient analysis.

12. A method as set forth in claim 11 wherein the dynamic stress time history is determined from a normal stress and a shear stress for the critical element at a filtered modal displacement.

* * * * *